United States Patent [19]

Matsushita

[11] Patent Number: 4,881,107
[45] Date of Patent: Nov. 14, 1989

[54] IC DEVICE HAVING A VERTICAL MOSFET AND AN AUXILIARY COMPONENT

[75] Inventor: Tsutomu Matsushita, Yokohama, Japan

[73] Assignee: Nissan Motor Company, Ltd., Yokohama, Japan

[21] Appl. No.: 213,073

[22] Filed: Jun. 29, 1988

[30] Foreign Application Priority Data

Jul. 3, 1987 [JP] Japan .................. 62-165487
Aug. 13, 1987 [JP] Japan .................. 62-200996

[51] Int. Cl.$^4$ .............................................. H01L 27/00
[52] U.S. Cl. ....................................... 357/23.4; 357/52; 357/47; 357/48; 357/63; 357/64
[58] Field of Search ................ 357/23.4, 52, 47, 48, 357/63, 64

[56] References Cited

U.S. PATENT DOCUMENTS 4,053,925 10/1977 Burr ............................ 357/48
4,559,086 12/1985 Hawkins ..................... 437/12
4,672,407 6/1987 Nakagawa ................ 357/23.4

FOREIGN PATENT DOCUMENTS 60-51700 3/1985 Japan .

OTHER PUBLICATIONS

Wrathall, "The Design of a High Power Solid State Automotive Switch in CMOS-VDMOS Technology", IEEE, Power Electronics Specialists Conference Record, 1985, pp. 229–233.

S. M. Sze, "Physics of Semiconductor Devices", John Wiley & Sons, New York, 1981, pp. 37–38.

Einzinger et al., "Monolithic IC Power Switch for Automotive Applications", ISSCC 1986, 1986 IEEE International Solid-State Circuits Conference, Feb. 19, 1986, pp. 22–23, 289.

Primary Examiner—Andrew J. James
Assistant Examiner—David L. Soltz
Attorney, Agent, or Firm—Foley & Lardner, Schwartz, Jeffery, Schwaab, Mack, Blumenthal & Evans

[57] ABSTRACT

A IC device includes an underlying layer of a first conductivity type, an overlying layer of the first conductivity type, an isolation layer of a second conductivity type formed between the underlying and overlying layers, and an isolation region of the second conductivity type extending into the overlying layer from a top surface and separating a second portion from a first portion of the overlying layer. The device also includes a channel region formed in the first portion of the overlying layer to form a vertical MOSFET and an auxiliary region formed in the second portion of the overlying layer to form an auxiliary integrated circuit component. A recombination layer of polycrystalline silicon or other material having abundant recombination centers is located under the second portion of the overlying layer.

17 Claims, 14 Drawing Sheets

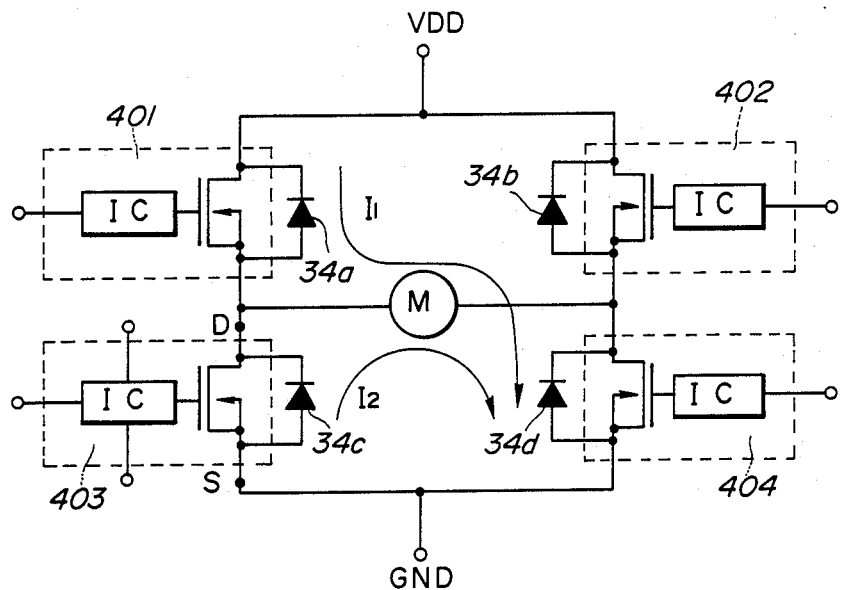
FIG. 6 *(PRIOR ART)*
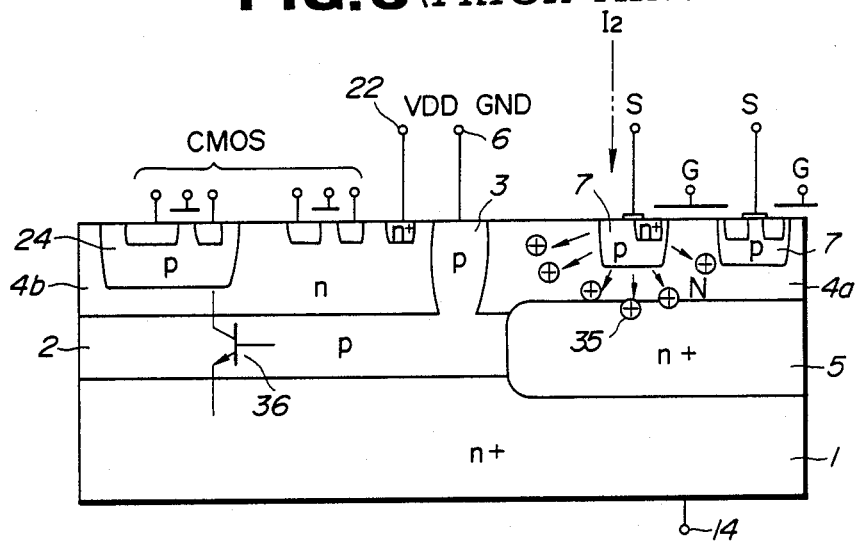
FIG. 7 *(PRIOR ART)*

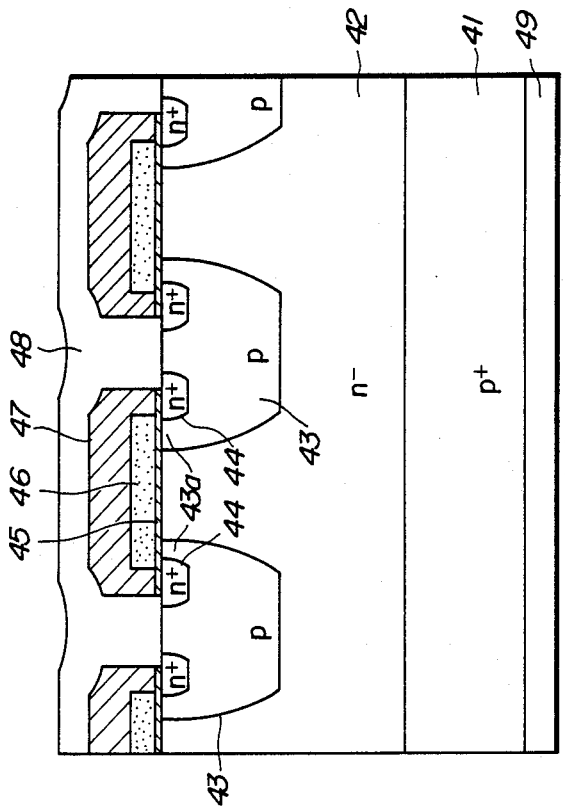
FIG.12 *(PRIOR ART)*
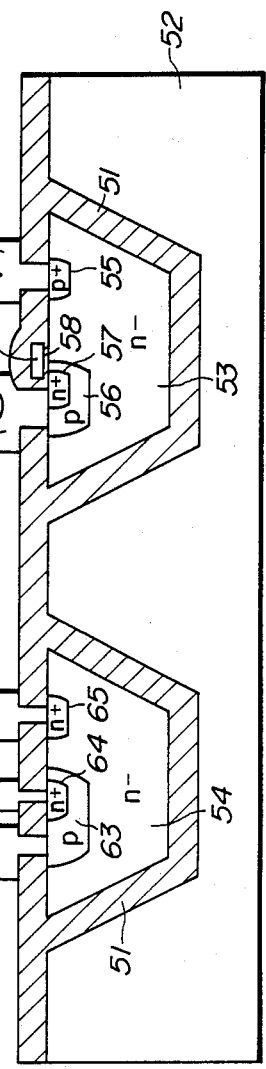
FIG.13 *(PRIOR ART)*

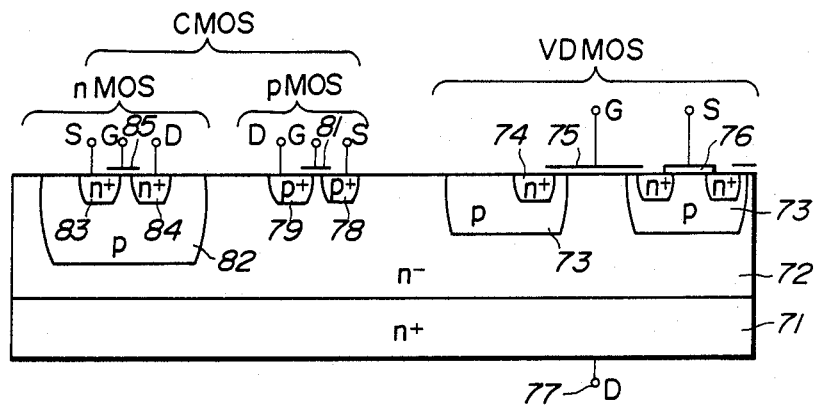
FIG.14 *(PRIOR ART)*
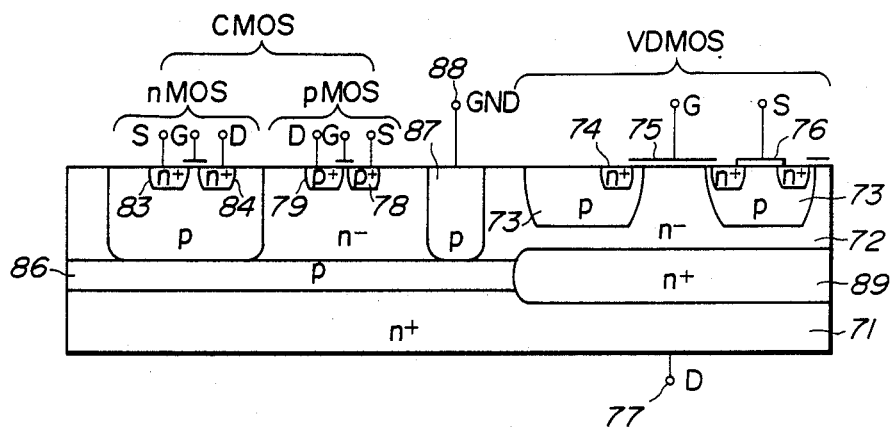
FIG.15 *(PRIOR ART)*

IC DEVICE HAVING A VERTICAL MOSFET AND AN AUXILIARY COMPONENT

REFERENCES TO RELATED APPLICATIONS

A U.S. patent application Ser. No. 07/196,714 filed in the name of Tsutomu MATSUSHITA on May 19, 1988, relates to a power integrated circuit (IC) having a polycrystalline silicon recombination layer and a guard ring separating a VDMOS and a CMOS.

A U.S. patent application Ser. No. 063,116, filed on June 17, 1987, relates to an IC device similar to that of the present invention. A U.S. application Ser. No. 119,453 discloses a carrier recombination layer similar to that of the present invention. A similar recombination layer is disclosed also in a U.S. application Ser. No. 179,315 filed April 8, 1988.

BACKGROUND OF THE INVENTION

The present invention relates to an IC device having a main power switching component such as a standard vertical MOSFET or a conductivity modulated MOSFET, and an auxiliary component such as a CMOS.

Recently, there has proposed an integrated circuit device (so-called power IC) in which a power VDMOS or a conductivity modulated MOSFET used as a switching element for various loads mounted on a vehicle, and other components, such as a CMOS forming a peripheral circuit of the switching element are monolithically formed in a single chip.

However, a conventional power IC of a standard vertical MOSFET type is unsatisfactory in that the possibility of the latchup of CMOS is too high, and a conventional power IC of a conductivity modulated type is unsatisfactory in that the characteristics of the conductivity modulated MOSFET are poor as compared with those of a discrete conductivity modulated MOSFET, and the fabrication process is problematical.

SUMMARY OF THE INVENTION

It is an object of the present invention to provide an IC device in which a vertical MOSFET and an auxiliary circuit component such as a CMOS are integrated in such a manner as to prevent latchup of the CMOS or the like.

It is another object of the present invention to provide an IC device in which a conductivity modulated MOSFET is integrated with an auxiliary component such as a CMOS in such an advantageous manner that the integrated conductivity modulated MOSFET can have characteristics at similar levels to a discrete device, and the IC device of a smaller size can be fabricated at a low cost.

According to the present invention, a semiconductor device includes at least an underlying layer, an overlying layer, an isolation layer and region, a channel region and an auxiliary region, which are all formed in a semiconductor substrate body. The underlying layer comprises a first layer of a first conductivity type such an n-type. The overlying layer is also of the first conductivity type, and is formed over the underlying layer. The isolation layer and regions are of a second conductivity type such as a p-type. The isolation layer is formed between the overlying layer and the first layer of the underlying layer. The isolation region extends into the overlying layer from an upper surface of the overlying layer, and reaches the isolation layer. The isolation region divides the overlying layer into first and second portions. The second portion of the overlying layer is separated from the underlying layer and the first portion of the overlying layer by the isolation layer and region. The channel region of the second conductivity type is formed in the first portion of the overlying layer to form a vertical MOSFET of a standard type or a conductivity modulated type. The auxiliary region is formed in the second portion of the overlying layer to form an auxiliary integrated circuit component.

The semiconductor device of the present invention may further comprise a recombination layer of material which is richer in recombination centers than the material of its surroundings. The recombination layer is formed under the second portion of the overlying layer.

BRIEF DESCRIPTION OF THE DRAWINGS

FIG. 6 is a circuit diagram showing a driving circuit for a DC motor, in which the conventional device of FIG. 5 is used.

FIG. 7 is a cross section similar to FIG. 5, for illustrating operations in the conventional device when used in the driving circuit of FIG. 6.

FIG. 12 is a cross section of a conductivity modulated MOSFET used in a conventional device.

FIG. 13 is a cross section of a conventional IC device.

FIG. 14 is a cross section showing another conventional example of an IC device.

FIG. 15 is a cross section showing still another conventional example of an IC device.

DETAILED DESCRIPTION OF THE INVENTION

Figure 5:
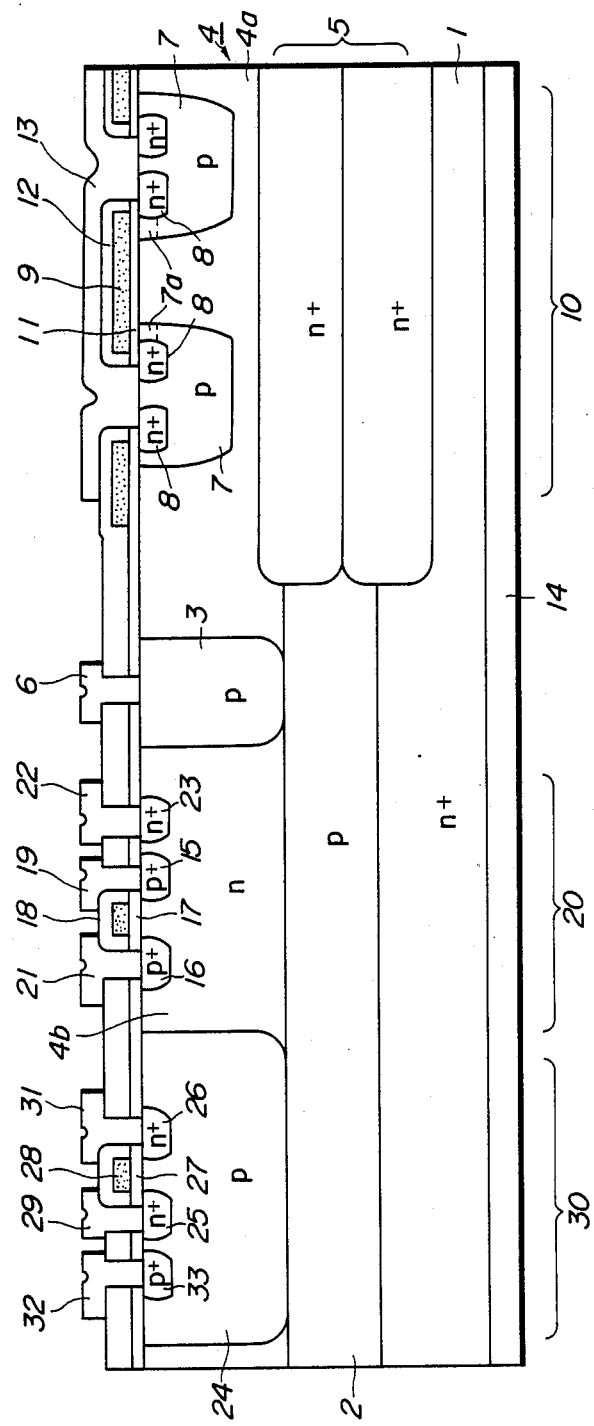
FIG. 5 is a cross section of one conventional semiconductor device.

To facilitate understanding of the present invention, reference is first made to a conventional device shown in FIG. 5.

The device of FIG. 5 has a standard vertical MOSFET (VDMOS) 10, and a CMOS consisting of a p channel MOSFET (pMOS) 20 and an n channel MOSFET (nMOS) 30, which are all formed in a single substrate body. This substrate body includes an n+ bottom layer 1, a p isolation layer 2, a p isolation region 3, an n top layer 4, and an n+ buried layer 5, as shown in FIG. 5. The isolation region 3 divides the top layer 4 into first and second portions 4a and 4b. The VDMOS 10 is formed in the first portion 4a, and the CMOS 20 and 30 is formed in the second portion 4b.

The VDMOS is superior as an output device of the power IC because the VDMOS is driven by voltage, and has a "high withstand voltage" advantage and a "low on resistance" advantage. On the other hand, the CMOS is well qualified as a logic device of the power IC because the power consumption is low and the noise margin is high.

However, the conventional power IC cannot reliably prevent interference between the VDMOS and CMOS in a dynamic and transient state, so that the conventional device is liable to malfunction as illustrated in FIG. 6 and 7.

In an example shown in FIG. 6, the power ICs are used in an H-bridge type driving circuit for driving a DC motor M in forward and reverse directions. The circuit of FIG. 6 has four power ICs 401–404, each of which has a pn junction 34a, 34b, 34c or 34d between a p channel region 7 of the VDMOS and the first n-type portion 4a of the top layer 4.

When both VDMOSes of the power ICs 401 and 404 are on, and both VDMOSes of the power ICs 402 and 403 are off, a motor driving current flows in a direction $I_1$. If the power IC 401 is turned off to reverse the motor at some instant, then a so-called flywheel current continues flowing in a direction $I_2$ for a while after that instant because of induction of the motor M. This flywheel current $I_2$ flows from the source electrode to the drain electrode in the VDMOS of the power IC 403. This flywheel current $I_2$ has a magnitude comparable to a steady driving current of the DC motor, and the current density becomes very high as compared with an external noise applied to a discrete CMOS.

In this state, the potential Vs of the source electrode 13 of the VDMOS 10 is equal to the potential GND of the ground. Therefore, the potential $V_D$ of the n-type first top region 4a as a drain is equal to a difference obtained by subtracting, from GND, a forward voltage Vf of the pn junction 34c between the p channel region 7 and the first n top region 4a ($V_D = GND - Vf$). Therefore, the pn junction 34c is forward biased, and holes 35 as minority carriers are injected in large quantities from the p channel region 7 into the first n top region 4a, as shown in FIG. 7.

On the CMOS's side within the power IC, there is formed a parasitic npn transistor 36 including the n+ layer 1 as an emitter, the p isolation layer as a base and the second n top region 4b as a collector, as shown in FIG. 7. In the state in which the potential $V_D$ of the n+ bottom layer 1 is made lower than GND by the flywheel current $I_2$, the base-emitter junction of the parasitic bipolar transistor 36 is forward biased and the parasitic transistor 36 is turned on.

As a result, the collector current of the parasitic transistor 36 flows into the CMOS, and the CMOS is easily brought into latchup by this collector current. Thus, the power IC is much more susceptible to latchup than a discrete CMOS because the current density of the flywheel current $I_2$ is high, and the potential decrease of the n+ bottom layer becomes great.

A first embodiment of the present invention is shown in FIGS. 1 and 2A–2J.

A power IC device of the first embodiment has a vertical MOSFET (VDMOS) 10 and a CMOS consisting of a p channel MOSFET (pMOS) 20 and an n channel MOSFET (nMOS) 30. All these components 10, 20 and 30 are formed in a single semiconductor substrate body.

Figure 1:
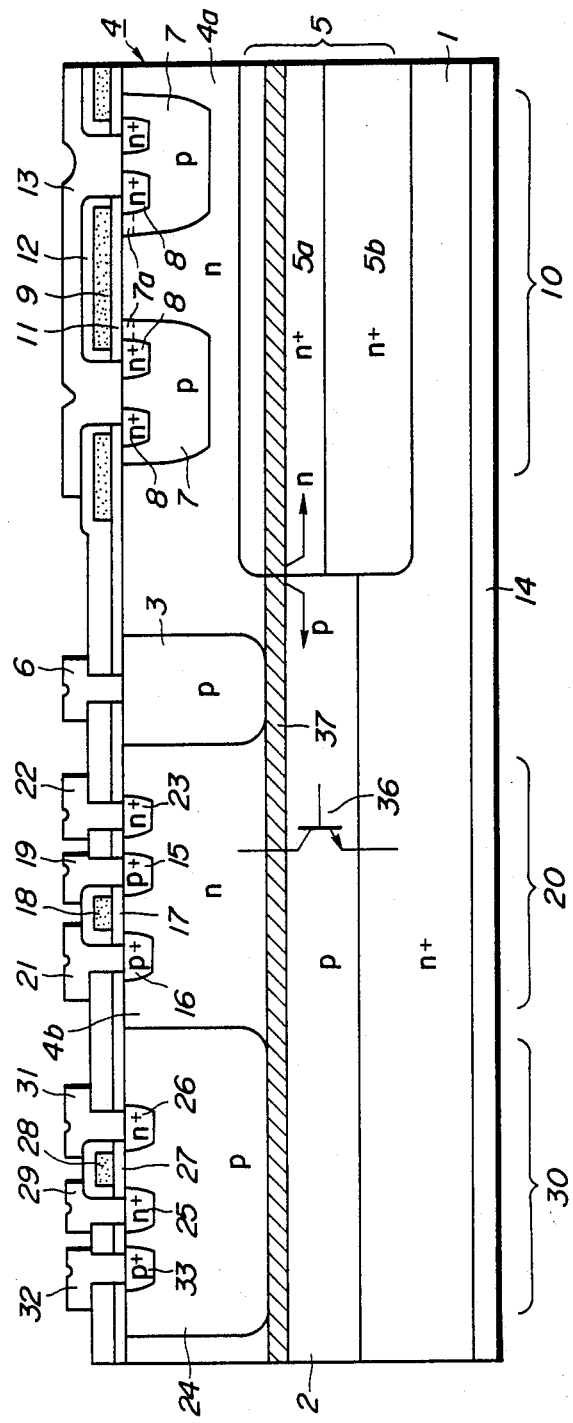
FIG. 1 is a cross section of a semiconductor device according to a first embodiment of the present invention.

As shown in FIG. 1, the substrate body includes a highly doped n+-type lower layer 1 extending from a bottom surface of the substrate body, a p-type isolation layer 2 formed on the lower layer 1 by epitaxial growth, and a lightly doped n-type upper layer 4 formed on the p isolation layer 2. A top surface of the substrate body is formed by the n upper layer 4. A p-type isolation wall region 3 is formed in the n upper layer 4. The isolation region 3 extends into the n upper layer 4 from the top surface of the substrate body, and reaches the p isolation layer 2. The n upper layer 4 is divided by the p isolation region 3 into a first n-type upper region 4a and a second n-type upper region 4b. That is, the first and second n upper regions 4a and 4b are separated by the p isolation region 3.

An n+-type buried layer 5 is formed under the first n upper region 4a. The buried layer 5 is bounded on the upper side by the first n region 4a, and on the lower side by the n+ lower layer 1. Therefore, the first n region 4a is connected to the n+ lower layer 1 through the n+ buried layer 5.

The second n upper region 4b is separated from both of the n+ lower layer 1 and the first n upper region 4a by the p isolation layer 2 and the p isolation region 3. The p isolation layer and region 2 and 3 are grounded through an isolation wall electrode 6.

The VDMOS 10 is formed in the first n upper region 4a in manner such that the first n upper region 4a is used as a substantial drain region. The VDMOS 10 includes a p-type channel region 7 extending into the first n upper region 4a from the top surface, and an n+ source region 8 formed in the p channel region 7. Over the p channel region 7 between the n+ source region 8 and the n-type first upper region 4a serving as a drain, there is formed a gate electrode 9 for inducing a channel 7a in a surface layer of the p channel region 7. The gate electrode 9 is formed on a gate oxide layer 11 which is formed on the top surface of the substrate body. The gate electrode 9 is covered by an intermediate insulating layer of PSG or the like. A topside source electrode 13 is connected with the n+ source region 8 and the p channel region 7. A bottom drain electrode 14 is formed on the bottom surface of the n+ lower layer 1.

The CMOS including the pMOS 20 and the nMOS 30 is formed in the second n upper region 4b. The CMOS is used as a component of a peripheral circuit which works in conjunction with the VDMOS 10.

The pMOS 20 includes p+ source region 15, and p+ drain region 16 which are both formed directly in the second n upper region 4b. Each of the source and drain regions 15 and 16 extend into the second n upper region 4b from the top surface. A gate oxide layer 17 is formed on the top surface of the substrate body, and a gate electrode 18 of the pMOS 20 is formed on the gate oxide layer 17. The pMOS 20 further includes a source electrode 19 and a drain electrode 21. A substrate contact electrode 22 is connected to the second n upper region 4b through an n+ substrate contact region 23 extending into the second n upper region 4b from the top surface.

The nMOS 30 is formed in a p well region 24 which is formed in the second n upper region 4b. The p well region 24 extends into the second n upper region 4b from the top surface. The nMOS 30 includes an n+ type pair of source and drain regions 25 and 26 each extending into the p well 24 from the top surface, a gate electrode 28 formed on a gate oxide layer 27, a source electrode 29, and a drain electrode 31. A well contact electrode 32 is connected to the p well 24 through a p+ well contact region 33 extending into the p well 24 from the top surface.

In the first embodiment, there is further provided a recombination layer 37 for facilitating recombination of minority carriers. The recombination layer 37 of this embodiment is formed between the p isolation layer 2 and the n upper layer 4, and extends into the n+ buried layer 5. The recombination layer 37 is made of material which has a superior capability of promoting recombination of minority carriers. The recombination layer 37 of this embodiment is a layer of polycrystalline silicon which is abundant in recombination centers and has an extremely high recombination velocity. The thickness of the recombination layer 37 is made equal to or greater than about 100 Å(angstrom) in order to prevent tunneling of minority carriers. The p isolation region 3 reaches the recombination layer 37 as shown in FIG. 1.

The recombination layer 37 has a first part which is formed on the p isolation layer 2 and a second part which is formed within the n+ buried layer 5. The first part of the recombination layer 37 is of the p-type, and the second part is of the n-type.

FIGS. 2A-2J show one example of a process for fabricating the IC device of FIG. 1.

Figure 2:
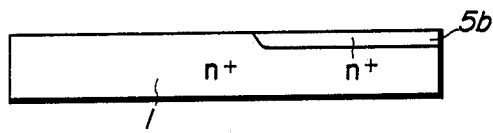
FIGS. 2A-2J are cross sections showing sequential steps of a process for fabricating the semiconductor device of FIG. 1.
Figure 2:
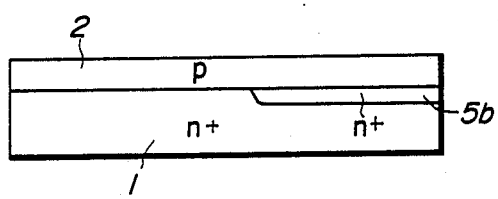
Figure 2:
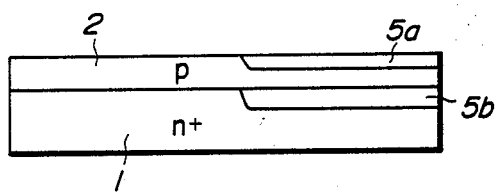
Figure 2:
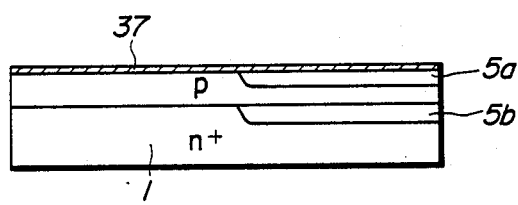
Figure 2:
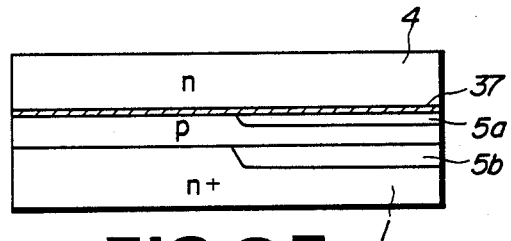
Figure 2:
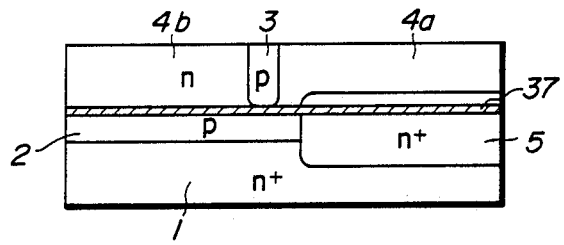
Figure 2:
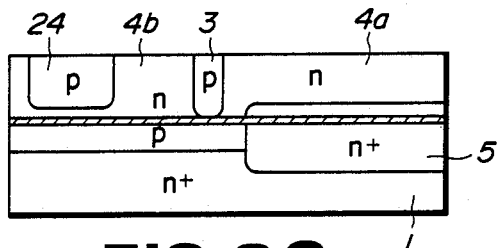
Figure 2:
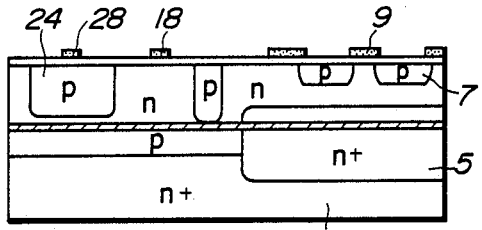
Figure 2:
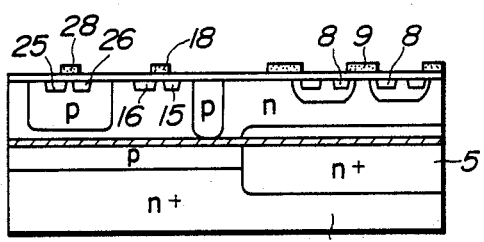
Figure 2:
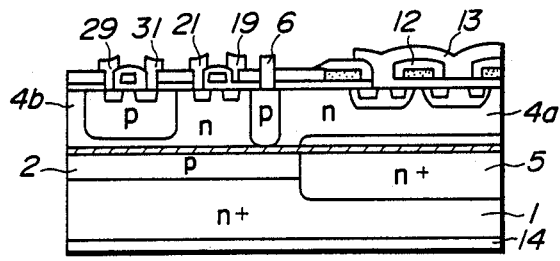

At a first step shown in FIG. 2A, an n+-type lower buried layer 5b is formed in a predetermined area of an n+ first substrate. The rest of the n+ first substrate becomes the lower layer 1 shown in FIG. 1. The n+ lower buried layer 5b is formed by introduction and diffusion of n-type impurities from the upper surface of the n+ substrate 1.

At a next step shown in FIG. 2B, the p isolation layer 2 is formed by epitaxial growth on the entire upper surface of the first substrate.

At a step shown in FIG. 2C, an n+ upper buried layer 5a is formed in the p isolation layer 2 in an area directly over the lower buried layer 5b. The upper buried layer 5a extends into the p isolation layer 2 from the upper surface of the p isolation layer 2.

At a step shown in FIG. 2D, the recombination layer 37 is formed on the entire upper surface of the first substrate of FIG. 2C, by depositing polycrystalline silicon by CVD. The polycrystalline silicon is doped with p-type impurities, so that the polycrystalline silicon recombination layer 37 is of the p type at this stage.

At a step of FIG. 2E, an n-type second silicon substrate forming the n upper layer 4 is bonded onto the upper surface of the recombination layer 37 of the first substrate shown in FIG. 2D. This bonding between the first and second semiconductor substrates is performed by first performing a treatment making the surfaces of both substrates hydrophilic, and then annealing at an appropriate temperature both substrates held tightly one on the other. This method of bonding two separate silicon wafers is known as disclosed in Japanese patent provisional publication No. 60-51700. The explanation of this document is incorporated herein by reference.

At a step of FIG. 2F, the p isolation wall region 3 is formed in the n upper layer 4 by introduction of p-type impurities and thermal diffusion of a predetermined time duration. Thus, the n upper layer 4 is divided into the first n upper region 4a and the second n upper region 4b by the p isolation region 3. At the same time, the n+ impurities in the n+ upper and lower buried layers 5a and 5b are redistributed, and the complete n+ buried layer 5 is formed. Thus, the n+ lower layer 1 and the first n upper region 4a are connected together through the n+ buried layer 5. During this step, the n-type impurities diffuse into the recombination layer 37 from the n+ buried layer 5, so that the second part of the recombination layer 37 which is in contact with the n+ buried layer 5 becomes an n+-type.

At a step of FIG. 2G, the p well region 24 is formed in the second n upper region by introduction and diffusion of p-type impurities.

At a step of FIG. 2H, the gate electrodes 9, 18 and 28 of the VDMOS 10, pMOS 20 and nMOS 30 are formed by depositing a polycrystalline Si layer and patterning the deposited layer by photoetching. Then, the p channel region 7 of the VDMOS 10 is formed by p-type impurity diffusion using the gate electrode 9 as a mask.

At a step of FIG. 2I, the n+ source region 8 of the VDMOS 10, and the n+ source and drain regions 25 and 26 of the nMOS 30 are formed by n-type impurity diffusion using the gate electrodes 9 and 28 as masks. The p+ source and drain regions 15 and 16 of the pMOS 20 are formed by p-type impurity diffusion using the gate electrode 18 as a mask.

At a step of FIG. 2J, contact holes are opened by photoetching after formation of the intermediate insulating layer 12 of PSG. Then, the electrodes 6, 13, 19, 21, 22, 29, 31 and 32 are formed by vapor deposition of an Al film and photoetching. The drain electrode 14 is formed on the entire bottom surface of the n+ lower layer 1. Finally, a final protective film (not shown) is formed, and a hole for a bonding pad is opened at a predetermined position.

The semiconductor device of the first embodiment is operated as follows.

The semiconductor device of the first embodiment can be used in a driving circuit of the H bridge type as shown in FIG. 6. In this case, the VDMOS 10 is driven by the peripheral circuit composed of the CMOS and is other components, and used as a switching device for an inductive load such as a DC motor.

Such an inductive load tends to cause a flywheel current to flow into the source electrode 13 of the VDMOS 10 during a transient period of switching operation as in the conventional device. From the topside source electrode 13, this current flows through the first n upper region 4a, the n+ buried layer 5 and the n+ lower layer 1, into the bottom drain electrode 14. Therefore, the potential of the n+ lower layer 1 is decreased, and the base-emitter junction of the parasitic transistor 36 is forward biased. As a result, electrons are injected as minority carriers from the n+ lower layer 1 which is the emitter of the parasitic bipolar transistor 36, into the p isolation layer 2 which is the base of the parasitic transistor 36.

However, these minority carriers are caused to recombine and disappear by the recombination layer 37 formed between the p isolation layer 2 and the n upper layer 4. Therefore, the recombination layer 37 significantly decreases the efficiency of minority carrier transport in the base of the parasitic bipolar transistor 36, and the parasitic bipolar transistor 36 is virtually prevented from being turned on. Thus, the structure of FIG. 1 can effectively prevent latch-up of the CMOS due to turn-on of the parasitic bipolar transistor 36.

Figure 3:
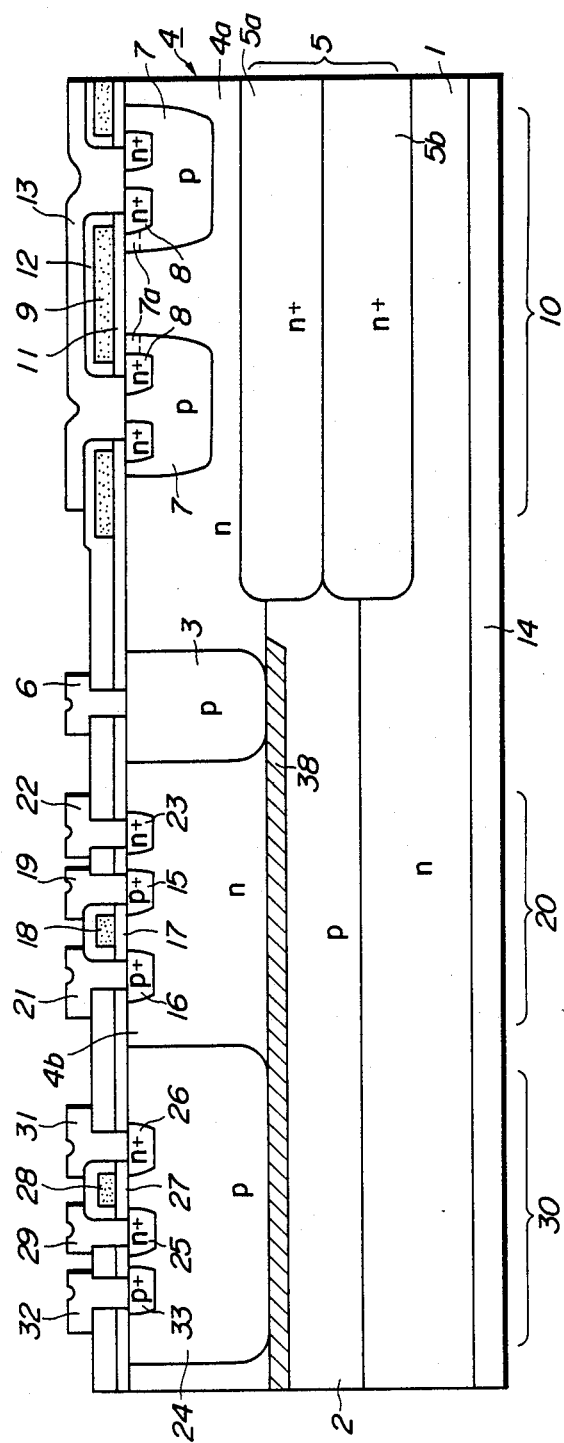
FIG. 3 is a cross section of a semiconductor device according to a second embodiment of the present invention.

A second embodiment of the present invention is shown in FIG. 3. In the second embodiment, a recombination layer 38 similar to the recombination layer 37 of the first embodiment is formed only between the second n upper region 4b and the p isolation layer 2, and no recombination layer is formed in the n+ buried layer 5. In other respects, the structure of the second embodiment is the same as the structure shown in FIG. 1.

The device of the second embodiment can be fabricated by slightly modifying the steps of FIGS. 2C and 2D of the fabricating process of the first embodiment. In the case of the second embodiment, a surface portion of the p isolation layer 2 is selectively removed by etching, at the step of FIG. 2C, to form a depression in a predetermined area of the surface of the p isolation layer 2. Then, the recombination layer 38 is formed by depositing polycrystalline silicon only in the depression.

The recombination layer 38 of the second embodiment can also cause the minority carriers injected into the p isolation layer 2 to disappear by recombination. Thus, the device of the second embodiment can effectively prevent latch-up of the CMOS in the same manner as the device of the first embodiment.

In the first embodiment, the recombination layer 37 has the second part formed in the n+ buried layer 5, and this second part has no function of promoting recombination of electrons because the second part of the recombination layer 37 is the n+ type. The second part of the recombination layer 37 formed under the first n-type upper region 4a does not exert undesired influence on the characteristics of the VDMOS 10 of the n channel type. However, a pn junction which is formed in the polycrystalline silicon may cause trouble by increasing a leakage current due to this pn junction, and decreasing the withstand voltage especially when the semiconductor device is constructed to have a high withstand voltage. In the recombination layer 38 of the second embodiment, there is formed no pn junction, so that no undesired influence is exerted.

Figure 4:
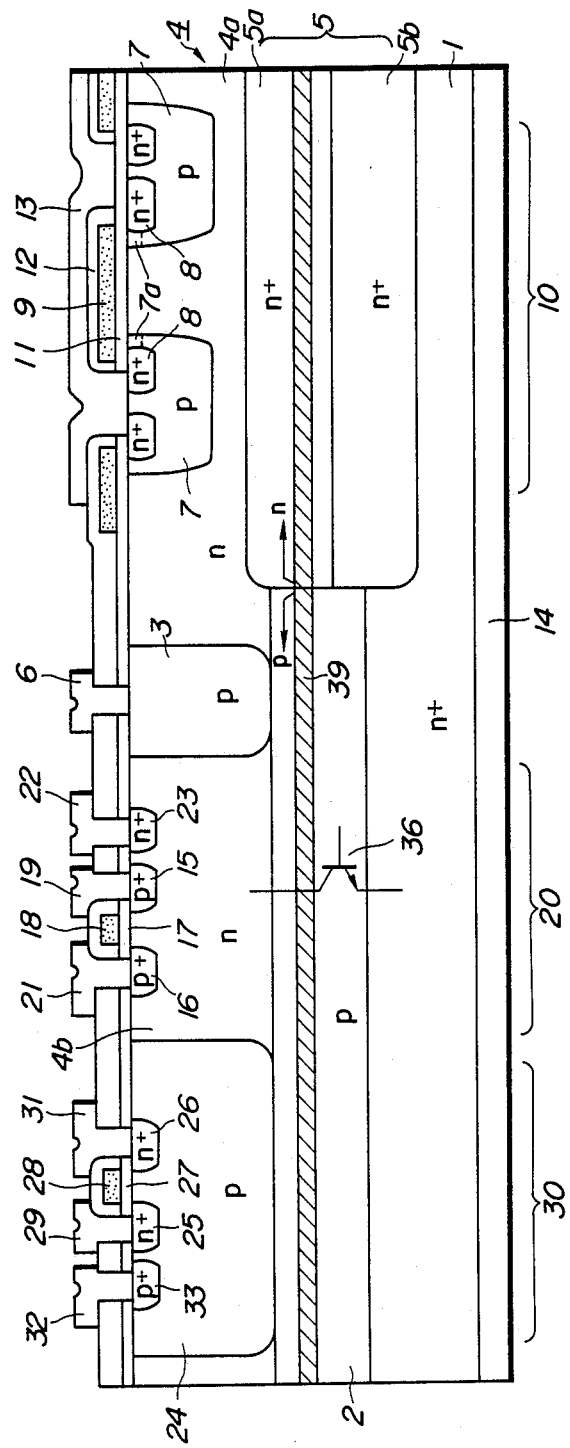
FIG. 4 is a cross section of a semiconductor device according to a third embodiment of the present invention.

A third embodiment of the present invention is shown in FIG. 4. In the third embodiment, a recombination layer 39 is formed within the p isolation layer 2 instead of in the interface between the n upper layer 4 and the p isolation 2. In other respects, the structure of the third embodiment is substantially the same as the structure of the first embodiment. The recombination layer 39 of the third embodiment extends into the n+ buried layer 5.

In the third embodiment, the fabrication process of FIGS. 2A-2J is modified as follows: At the step of FIG. 2B, a lower half of the p isolation layer 2 is first formed, and then the recombination layer 39 is formed on this lower half by depositing polycrystalline silicon. Then, an upper half of the p isolation layer 2 is formed on the recombination layer 39 by bonding a p-type semiconductor substrate onto the recombination layer 39 by the above-mentioned method of bonding two separate wafers together. After that, the upper n+ buried layer 5a is formed in a predetermined area, and then the n upper layer 4 is formed by epitaxial growth. Then, the steps of FIGS. 2F-2J follow.

The recombination layer 39 can also cause the minority carriers injected into the p isolation layer 2 to disappear by recombination, so that latch-up of the CMOS is effectively prevented in the same manner as in the preceding embodiments.

In the structure of the first embodiment in which the recombination layer 37 is located in the interface between the p isolation layer 2 and the n upper layer 4, electrical separation between the first and second n-type upper regions 4a and 4b is achieved by application of a reverse bias to the pn junctions between the p-type isolation layer and regions 2 and 3, and the n-type first and second upper regions 4a and 4b. In the first embodiment, however, the recombination layer of polycrystalline silicon exists in a part of the p sides of the pn interfaces, so that a leakage current tends to increase as compared with a pn junction between single crystal silicons. Such an increase of the leakage current is troublesome especially when the device is used at high temperatures or the device is constructed to have a high withstand voltage.

The structure of the third embodiment is free from such a problem because the polycrystalline silicon recombination layer 39 of the third embodiment is formed inside the p isolation layer 2, and the polycrystalline silicon is located away from the pn junction for electrical isolation between the first and second n upper regions 4a and 4b.

It is possible to form the recombination layer 39 of the third embodiment only between the second n upper region 4b and the p isolation layer 2 without forming any recombination layer in the n+ buried layer 5, as in the second embodiment. In this case, the advantage of the second embodiment is obtained in addition to the advantage of the third embodiment.

In each of the first, second and third embodiments, the polycrystalline silicon recombination layer 37, 38 or 39 has such a high capability of causing minority carriers to recombine that a recombination layer of a small thickness is sufficient for the purpose of the invention. Furthermore, it is possible to accurately form the polycrystalline layer of a required thickness at a required position. Therefore, the polycrystalline silicon recombination layer exerts little influences on the VDMOS 10, the pMOS 20, the nMOS 30 and other integrated components. The recombination layer of each embodiment is made of the material which is widely used in usual IC fabrication processes, so that no special fabricating equipment is required, and the cost is not increased.

It is possible to form the recombination layer of the present invention by irradiation with electrons or neutrons or by other high energy irradiation, to single crystal silicon, instead of using polycrystalline silicon. In this case, the high energy irradiation produces many crystal imperfections serving as recombination centers, in the single crystal silicon layer. The thus-obtained crystal damage silicon layer can be used as the recombination layer of the present invention. In the present invention, it is possible to use a p channel-type VDMOS instead of an n channel type VDMOS. Furthermore, it is possible to form a vertically extending recombination region of polycrystalline silicon in place of the p isolation region 3. In this case, the vertical polycrystalline silicon recombination region formed at the position of the isolation region 3 can further reduce the possibility of latch-up by preventing injection of holes in the lateral direction.

Figure 8:
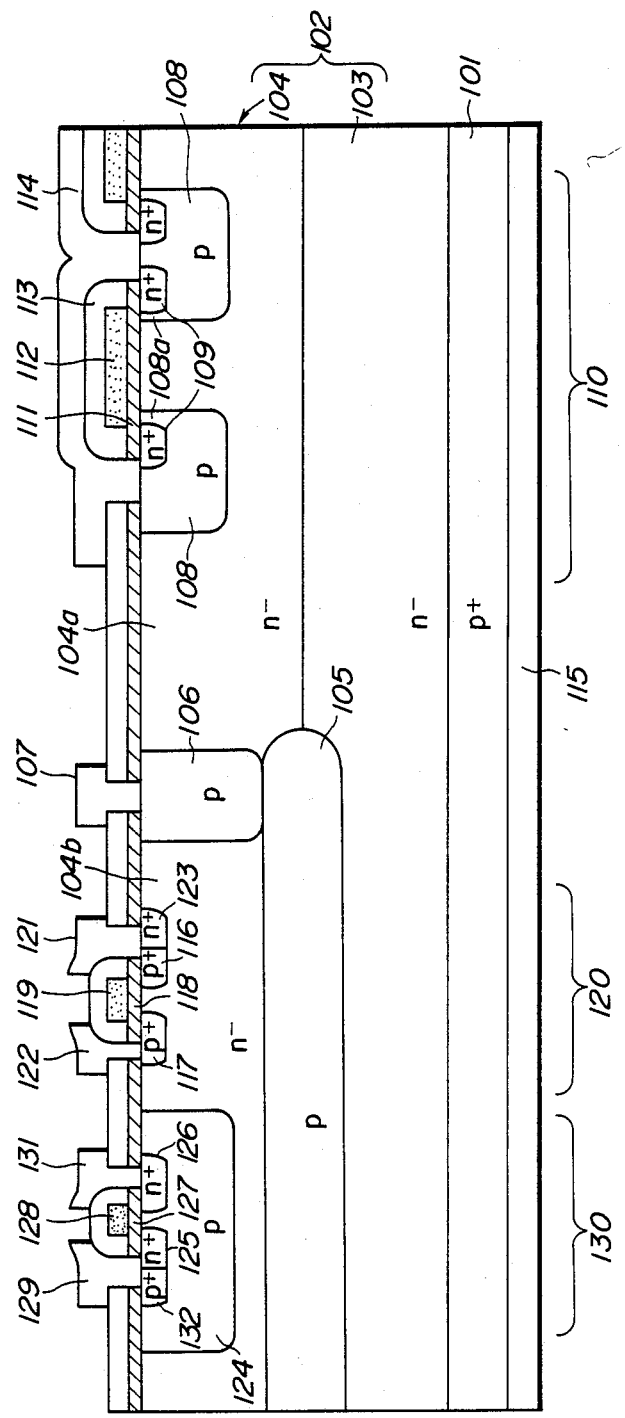
FIG. 8 is a cross section of a semiconductor device according to a fourth embodiment of the present invention.

A fourth embodiment of the present invention is shown in FIG. 8. In the fourth embodiment, a conductivity modulated MOSFET is integrated with a CMOS or other components within a single chip.

To facilitate understanding of the fourth embodiment, reference is made to conventional examples shown in FIGS. 12-15.

FIG. 12 shows a discrete conductivity modulated MOSFET device as a conventional example.

The device of FIG. 12 has a p+ anode region 41 of a first conductivity type serving as source of holes to be injected, and an n−-type base region 42 of a second conductivity type functioning substantially as a drain. A p-type channel region 43 is formed in an upper part of the n⁻ base region 42, and an n+ type source region 44 is formed in the p channel region 43. Over the p channel region 43 between the n+ source region 44 and the n⁻ base region 42, there is formed a gate electrode 46 for inducing a channel 43a in the surface layer of the p channel region 43. The gate electrode 46 is separated by a gate oxide film 45 from the semiconductor surface. The device further includes an intermediate insulating layer 47, a source electrode 48 connected to the n+ source region 44 and the p channel region 43, and an anode electrode 49 formed on the bottom of the p+ anode region 41.

The conductivity modulated MOSFET is different from a standard vertical power MOSFET (VDMOS) in that the p+ anode region 41 is added to the region corresponding to the drain.

When the channel 43a is induced directly under the gate electrode 46 by application of a predetermined positive voltage to the anode electrode 49 and a gate voltage beyond the threshold voltage to the gate electrode 46, then electrons flow from the n+ source region 44 through the channel 43a into the n⁻ base region 42. On the other hand, holes are injected as minority carriers from the p+ anode region 41 into the n⁻ base region 42.

A portion of the holes injected into the n⁻ base region 42 recombine with the electrons coming through the channel 43a, and another part of the injected holes reach the p channel region 43 and flow out into the source electrode 48. Nevertheless, a great number of carriers are accumulated in the n⁻ base region 42, and these excess carriers modulate the conductivity, and reduce the on resistance.

Thus, the conductivity modulated MOSFET is superior in that the on resistance can be dramatically reduced while holding the withstand voltage as high as several hundred V or more. Therefore, a power IC including such a superior conductivity modulated MOSFET which is integrated in a single chip with a peripheral circuit such as a circuit for driving, controlling or protecting the MOSFET, is very advantageous in that reduction of the device's size, reduction of the packaging cost, cost reduction and performance improvement due to elimination of interconnection and realization of new functions are possible, and in that the potential applications are numerous.

FIG. 13 shows such a power IC of a conventional type. In this conventional example, the electrical separation between the conductivity modulated MOSFET and other integrated components is achieved by dielectric isolation.

In one fabrication method, a deep V-shaped groove having a depth of several tens of micrometers is first formed in a single crystal substrate, and then an SiO₂ film 51 of an appropriate thickness is formed in the V-shaped groove by thermal oxidation. After that, a polycrystalline silicon layer 52 is deposited to a thickness of several hundred micrometers. Then, the single crystal layer is lapped from the bottom of the substrate until the innermost portions of the V-shaped groove appear on the wafer surface. Thus, dielectrically isolated single crystal silicon pockets or 53 and 54 are provided in the polycrystalline silicon substrate layer 52.

A lateral type conductivity modulated MOSFET is formed in the island 53 so that the n⁻ island 53 is used as a n⁻ base region. There are further formed p+ anode region 55, p-type channel region 56, n+ source region 57, gate oxide film 58, gate electrode 59, source electrode 61 and anode electrode 62.

In this example, an npn bipolar transistor is formed in the other island 54 so that the island 54 itself is used as a collector region. There are formed p base region 63, n+ emitter region 64, n+ collector contact region 65, emitter electrode 66, base electrode 67 and collector electrode 68. Thus, the high voltage conductivity modulated MOSFET is separated from the bipolar transistor or other device by the SiO₂ insulating layer 51.

However, in this conventional structure, it is not possible to provide the anode electrode on the bottom side because of the supporting structure of the polycrystalline silicon layer 52 and the insulating layer 51. This conventional structure has the anode electrode 62 on the top side, and employs the conductivity modulated MOSFET of the lateral type which is difficult to sufficiently reduce the on resistance. Furthermore, the process for forming the dielectrically isolated pockets is complicated and costly because many special fabricating steps are required.

FIG. 14 shows another conventional power IC structure having a standard VDMOS, and employing another isolation technique.

The power IC of FIG. 14 has an n+ substrate, and an n⁻ epitaxial surface layer 72. A VDMOS and a CMOS are formed in the n⁻ surface layer 72. The VDMOS includes a p channel region 73 which is formed in the surface layer 72 and serves substantially as a drain region, an n+ source region 74, gate electrode 75, a source electrode 76, and drain electrode 77. The CMOS consists of a p channel MOSFET (pMOS) and an n channel MOSFET (nMOS). A p+ pair of source and drain regions 78 and 79 of the pMOS are directly formed in the n⁻ surface layer 72. The pMOS further includes an insulated gate electrode 81. An n+ pair of source and drain regions 83 and 84 of the nMOS are formed in a p well 82 formed in the n⁻ surface layer 72. The nMOS further includes an insulated gate electrode 85. This conventional power IC structure can be fabricated by the standard IC fabrication technology including epitaxial growth, thermal oxidation and impurity diffusion.

When the supply voltage V_DD is applied from the drain electrode 77, the potential of the n⁻ surface layer 72 of this conventional structure of FIG. 14 is fixed at the supply voltage V_DD, and each of the pn junctions between the n⁻ surface layer 72, and the p channel region 73, p+ source region 78, p+ drain region 79 and p well 82 is reverse biased, so that the VDMOS and CMOS are electrically separated and allowed to function independently from each other. This isolation technique is applicable only when MOS devices are integrated with the VDMOS.

It seems possible to obtain a low cost power IC including a conductivity modulated MOSFET by adding a p+ anode layer to the VDMOS in the structure of FIG. 14. However, the conductivity modulated MOSFET has a characteristic of a high withstand voltage more than several hundred V, and such a high voltage is applied to the n⁻ surface layer 72. Therefore, the pMOS and nMOS formed in the n⁻ surface layer are required to have such high voltage characteristics. It is very difficult to fulfill such a requirement.

FIG. 15 shows still another conventional power IC structure in which a junction isolation technique is used. The structure of FIG. 15 is different from the structure of FIG. 14 only in the following points.

In the structure of FIG. 15, a p-type isolation layer 86 is formed between the n+ substrate 71 and the part of the n− surface layer 72 in which the CMOS is formed. In the n− surface layer 72, there is further formed a p-type isolation diffusion region 87 extending into the n− surface layer from the upper surface and reaching the p isolation layer 86. The p isolation layer and region 86 and 87 are grounded through an isolation wall electrode 88. On the VDMOS's side, there is formed, under the n− surface layer 72, an n+ buried layer 89 to decrease the on resistance. On the VDMOS's side, the n− surface layer 72 and n+ substrate 71 are connected through the n+ buried layer 89. This structure can be also fabricated by the standard IC fabricating processes such as epitaxial growth, oxidation and diffusion.

In this structure, the pn junctions between the n-type regions 71 and 72 and the p-type regions 86 and 87 are reverse biased, and the CMOS and VDMOS are electrically separated and allowed to act individually.

However, in order to obtain a high withstand voltage of about several hundred V, the thickness of the n− surface layer 72 must be made as thick as several tens of micrometers because the highly doped n+ buried layer 89 is formed in the VDMOS. The n− surface layer 72 of such a great thickness makes it very difficult to form the p isolation region 87 by diffusion. Furthermore, it is difficult to ensure a high withstand voltage of the junction between the n+ buried layer 89 and the p isolation layer.

For these reasons, it is difficult to form a conductivity modulated MOSFET type power IC by adding a p+ anode region to the VDMOS having the structure of FIG. 15.

Therefore, the power IC of the type using a conductivity modulated MOSFET having characteristics comparable to those of a discrete device is not in the market notwithstanding a strong demand.

In the fourth embodiment of the present invention, a power IC device, as shown in FIG. 8, includes a highly doped p+ bottom layer 101, and a lightly doped n− upper layer 102 formed on the p+ bottom layer 101. The n− upper layer 102 includes an n− intermediate layer 103 formed on the p+ bottom layer 101, and an n− top layer 104 formed on the intermediate layer 103. The two-layered n− upper layer 102 is made sufficiently thick to a predetermined thickness. In a predetermined area, a p-type isolation layer 105 is formed between the intermediate and top n− layers 103 and 104. In the top n− layer 104, a p-type isolation diffusion region 106 is formed by diffusion of p-type impurities. The p isolation region 106 extends into the top n− layer 104 from the top surface, and reaches the p isolation layer 105. The p isolation region 106 is grounded through an isolation wall electrode 107.

The two-layered n− upper layer 102 of the predetermined thickness and the p isolation layer 105 can be formed in the following manner.

First, the n− intermediate layer 103 is formed on the p+ bottom layer 101 by epitaxial growth. Thus, a first substrate body is formed. On the other hand, the p isolation layer 105 is formed in a predetermined part of the major surface of another substrate forming the n− top layer 104. The p isolation layer 105 is formed by introduction and diffusion of p-type impurities. Thus, a second substrate body is formed. Then, the first and second substrate bodies are directly bonded together by the method of Japanese patent provisional publication No. 60-51700. Thus, the two-layered n− upper layer 102 is formed, and at the same time the p isolation layer 105 is interposed between the first and second upper layers 103 and 104.

In the structure of FIG. 8, the n− top layer 104 is divided into a first n− top region 104a and a second n− top region 104b by the p isolation layer 105 and the p isolation region 106. That is, the first and second n− regions 104a and 104b are separated by the p isolation layer and region 105 and 106. The first n− region 104a is used as a base region.

A conductivity modulated MOSFET 110 is formed on the 104a side. The first top region 104a is used as a virtual drain region. The p+ bottom layer 101 is used as a region for injecting minority carriers (holes) into the n− upper layer 102 serving as a base region, to cause conductivity modulation.

A p channel region 108 is formed in the first n− top region 104a from the top surface. An n+ source region 109 is formed in the p channel region 108 from the top semiconductor surface. Over the p channel region 108 between the n+ source region 108 and the first n− top region 104a serving as a base region, there is formed an insulated gate electrode 112 for inducing a channel 108a in the p channel region 108. The gate electrode 112 is insulated from the semiconductor surface by a gate oxide layer 111. There are further provided an intermediate insulating layer 113 of PSG, and a source electrode 114 which is connected to the n+ source region 109 and the p channel region 108. An anode electrode 115 is formed on the bottom of the p+ bottom layer 101.

The CMOS consisting of pMOS 120 and nMOS 130 is formed in the second n− top region 104b.

The pMOS 120 includes a pair of p+ source region 116 and p+ drain region 117 which are both formed in the second n− top region 104b, a gate electrode 119 formed on a gate oxide layer 118, a source electrode 121, and a drain electrode 122. The source electrode 121 is connected to the second top region 104b through an n+ substrate contact region 123.

A p well region 124 is formed in the second n− top region 104b. The nMOS 130 includes a pair of n+ source region 125 and n+ drain region 126 which are both formed in the p well 124, a gate electrode 128 formed on a gate insulating layer 127, a source electrode 129 and a drain electrode 131. The source electrode 129 is connected to the p well 124 through a p+ well contact region 132.

The power IC device of FIG. 8 is operated as follows.

The conductivity modulated MOSFET 110 of the fourth embodiment has a sufficiently high withstand voltage because the n− upper layer 102 serving as a base region is sufficiently thick, and there is no n+ buried layer.

When a positive voltage of a predetermined value is applied to the anode electrode 115, the pn junctions between the n− upper layer 102 and the p type isolation region 106 and layer 105 which are grounded through the isolation wall electrode 107, is reverse biased, so that the conductivity modulated MOSFET 110 and the CMOS 120 and 130 are electrically separated from each other. Then, the conductivity modulated MOSFET 110 is driven by the peripheral circuit composed of the CMOS and other components, and is used as a switching means for a load.

Application of a positive voltage of a required value to the anode electrode 115, and of a gate voltage equal to or higher than the threshold voltage to the gate electrode 112 makes conductive the channel 108a immediately below the gate electrode 112, so that electrons flow from the n+ source region 109 through the channel 108a into the n− upper layer 102 which is the base region. On the other hand, as shown in FIG. 9, holes 133 are injected in large quantities from the p+ bottom layer 101 into the n− upper layer 102 having a sufficient thickness.

A part of the holes 133 injected into the n− upper layer 102 recombine with the electrons coming through the channel 108a, and another part of the holes 133 flow into the p channel region 108 and reach the source electrode 114. During this, carriers are accumulated in large quantities in the n− upper layer 102, and these excess electrons and holes modulate, or increase, the conductivity of the n− upper layer 102. Therefore, the conductivity modulated MOSFET of the fourth embodiment is sufficiently low in the on resistance in spite of the large thickness of the n− upper layer 102. The conductivity modulated MOSFET possessing, in combination the low on resistance, and the high voltage handling capability is able to act very efficiently as a switching means for a power load.

Figure 9:
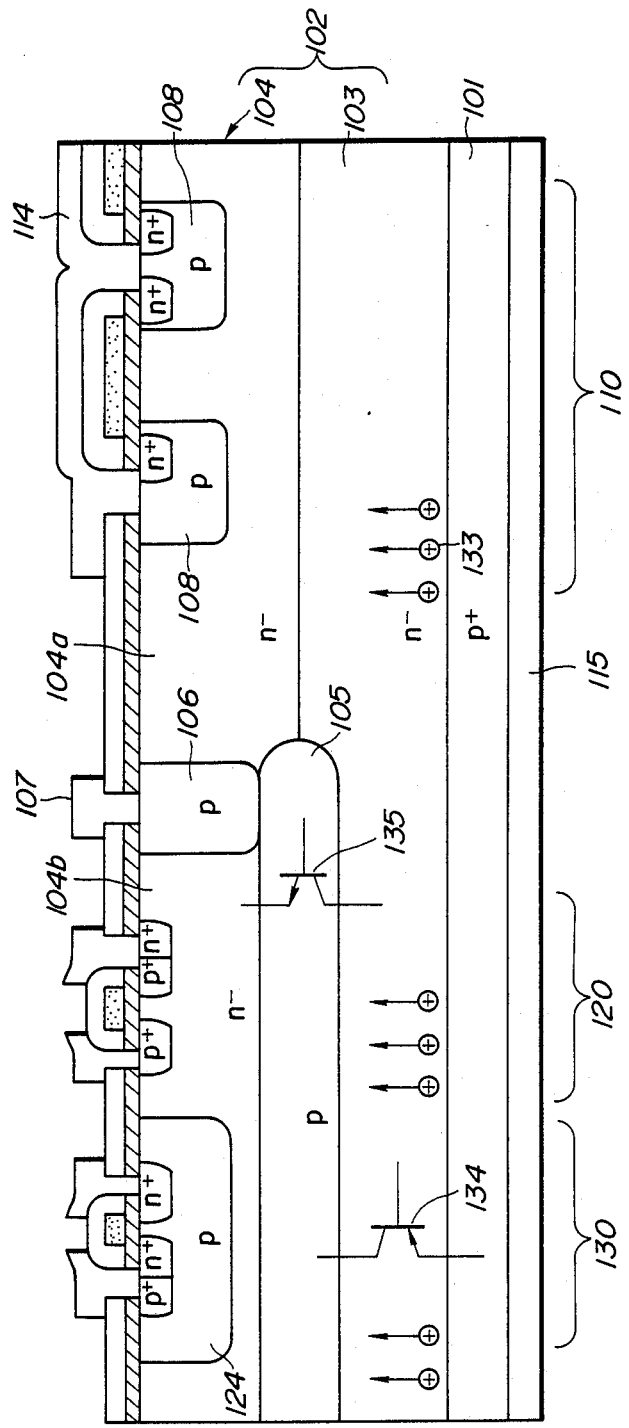
FIG. 9 is a cross section similar to FIG. 8, for showing operations of the device of FIG. 8.

In this power IC structure of the fourth embodiment, there are formed parasitic bipolar transistors 134 and 135 are formed as shown in FIG. 9. The parasitic transistor 134 is a pnp transistor formed among the p+ bottom layer 101, the n− upper layer 102 and the p isolation layer 105. The parasitic transistor 135 is an npn transistor formed among the n− upper layer 102, the p isolation layer 105 and the n− second top region 104b.

Figure 10:
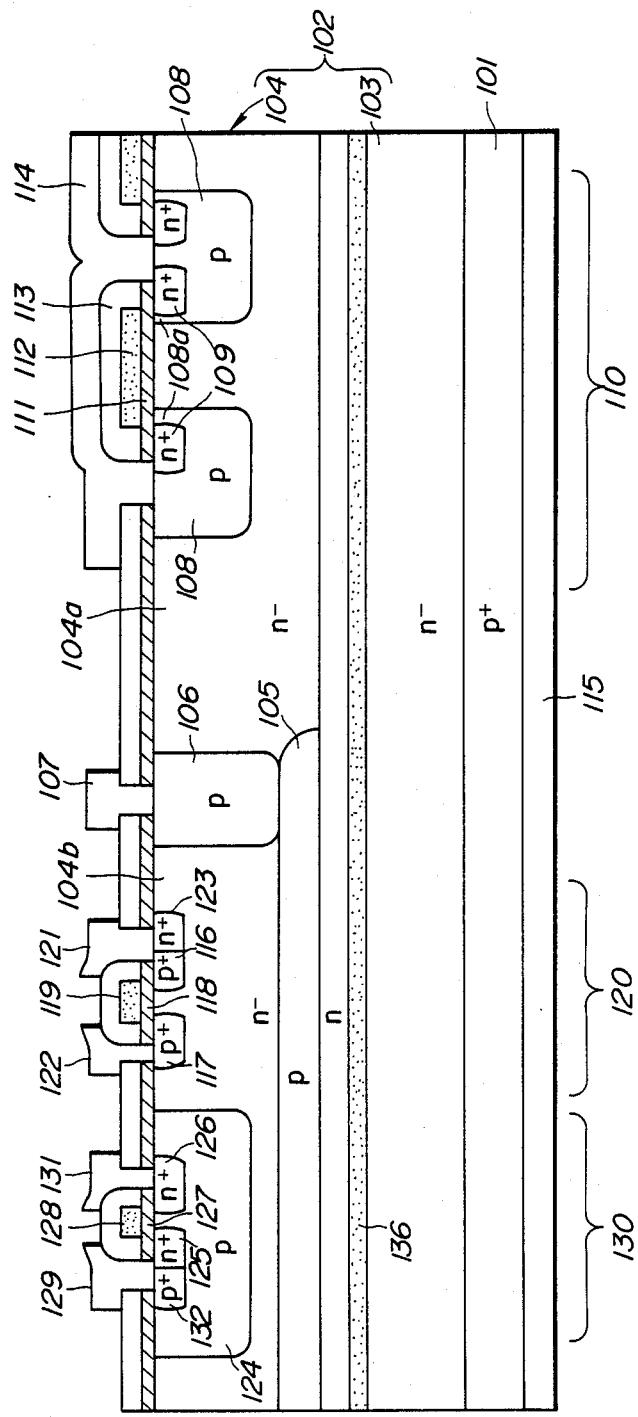
FIG. 10 is a cross section of a semiconductor device according to a fifth embodiment of the present invention.

A fifth embodiment of the present invention is shown in FIGS. 10 and 11A–11J. The structure shown in FIG. 10 is similar to the structure of FIG. 8, but different in the following points.

In the fifth embodiment, an n-type recombination layer 136 for recombination of minority carriers (holes) is formed in the n− intermediate layer 103 in order to prevent latch-up due to the parasitic transistors 134 and 135 which are formed in the same manner as shown in FIG. 9. The n-type recombination layer 136 is formed near the interface between the n− intermediate layer 103 and the n− top layer 104. The recombination layer 136 of this embodiment is also a layer of polycrystalline silicon which is high in capability of promoting recombination of minority carriers, and high in recombination velocity.

The recombination layer 136 is formed within the n− intermediate layer 103, at a shallow position from the upper surface of the n− intermediate layer 103. The distance between the recombination layer 136 and the top surface of the n− intermediate layer 103 is much smaller than the distance between the recombination layer 103 and the bottom of the n− intermediate layer 103, as shown in FIG. 10. Therefore, the portion of the n− intermediate layer 103 receiving the conductivity modulation due to hole injection from the p+ bottom layer 101 is made so thick as to ward off an undesired influence on the on resistance. The polycrystalline silicon recombination layer 136 is not in contact with the p isolation layer 105 which is formed between the n− intermediate layer 103 and the n− top layer 104. The pn junction for junction isolation is formed between the single crystal p isolation layer 105 and the single crystal n− upper layer 102, so that the structure of FIG. 10 can prevent undesired increase of the leakage current, and undesired decrease of the withstand voltage.

FIGS. 11A–11J show sequential steps of one process for fabricating the device of FIG. 10.

Figure 11A:
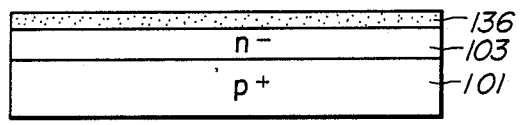
FIGS. 11A-11J are cross sections showing sequential steps of a process for fabricating the device of FIG. 10.

At a first step shown in FIG. 11A, a lower half of the n− intermediate layer 103 is formed, by epitaxial growth, on the p+ bottom layer 101. Then, the n-type polycrystalline silicon recombination layer 136 is formed on the lower half of the n− intermediate layer 103 by depositing polycrystalline silicon to a predetermined thickness by CVD. Thus, a first substrate body shown in FIG. 11A is obtained.

Figure 11B:
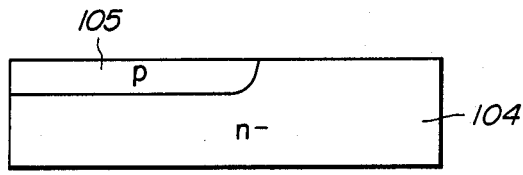

At a next step shown in FIG. 11B, the p isolation layer 105 is formed selectively in another substrate which becomes the n− top layer 104. The p isolation layer 105 is formed by introduction and diffusion of p-type impurities to the n− substrate.

Figure 11C:
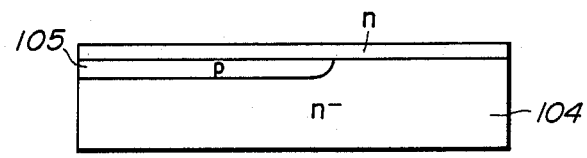

At a step of FIG. 11C, an upper half of the n− intermediate layer 103 is formed by epitaxial growth on the substrate obtained by the step of FIG. 11B. Thus, a second substrate body shown in FIG. 11C is obtained.

Figure 11D:
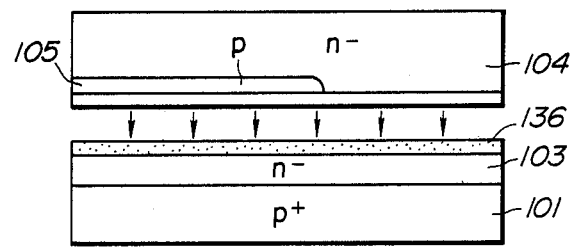

At a step of FIG. 11D, the first substrate body shown in FIG. 11A, and the second substrate body shown in FIG. 11C are bonded together by the method disclosed in Japanese patent provisional publication 60-51700. The upper half of the n− intermediate layer 103 is bonded onto the recombination layer 136 of the first substrate body.

Figure 11E:
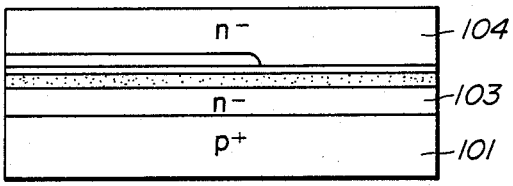

At a step of FIG. 11E, the thickness of the n− top layer 104 is reduced to a predetermined value by lapping or the like.

Figure 11F:
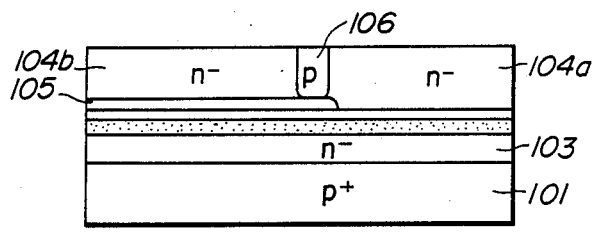

At a step of FIG. 11F, the p isolation region 106 is formed by p-type impurity introduction and diffusion in the n− top layer 104. The p isolation region 106 extends into the n− top layer 104 from the top surface and reaches the p isolation layer 105. Thus, the second top region 104b is separated from the first top region 104a.

Figure 11G:
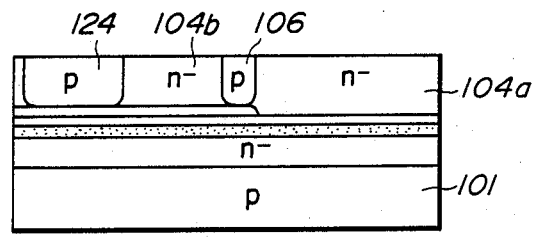

At a step of FIG. 11G, the p well 124 is formed in the second top region 104b, by p-type impurity introduction and diffusion.

Figure 11H:
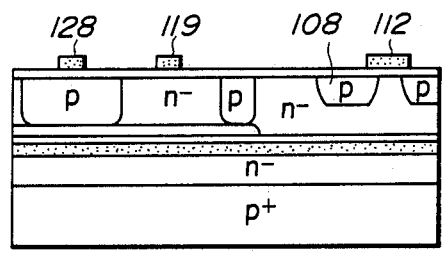

At a step of FIG. 11H, the insulated gate electrodes 112, 119 and 128 are formed by depositing a polycrystalline silicon layer and patterning the deposited layer by photoetching. Then, the p channel region 108 is formed in the first top region 104a by p-type impurity diffusion using the gate electrode 112 as a mask.

Figure 11I:
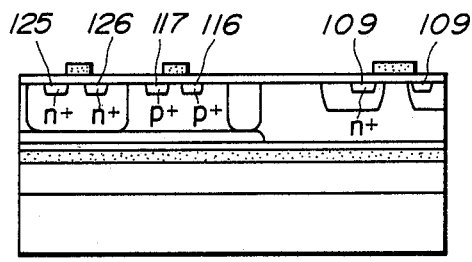

At a step of FIG. 11I, the n+ regions 109, 125 and 126 are formed by n-type impurity diffusion using the gate electrode 112 and 128 as masks. The p+ regions 116 and 117 are formed by p-type impurity diffusion using the gate electrode 119 as a mask.

Figure 11J:
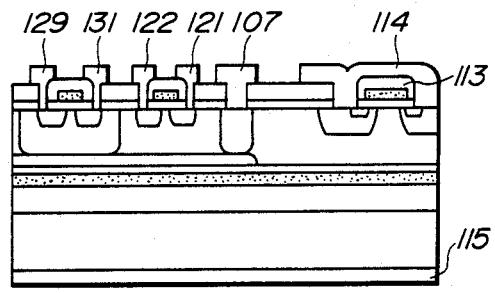

At a step of FIG. 11J, the intermediate insulating layer 113 of PSG is formed, and then contact holes are opened by photoetching. After that, the electrodes 107, 114, 121, 122, 129 and 131 are formed by vapor deposition and photoetching of an Al film. The anode electrode 115 is formed on the entirety of the bottom.

The thus-constructed power IC device of the fifth embodiment is operated as follows:

The structure of FIG. 10 can prevent latch-up of the pMOS 120 and the nMOS 130 which are relatively low in withstand voltage, in the following manner.

The parasitic pnp transistor 134 and the parasitic npn transistor 135 shown in FIG. 9 are formed also in the structure of FIG. 10. Therefore, the parasitic pnp transistor 134 is first turned on by the injection of holes 133 from the p+ bottom layer 101 into the n− intermediate layer 103. Then, the collector current of the parasitic transistor 134 flows through the p isolation layer 105 and region 106, and the npn parasitic transitic transistor 135 is turned on, so that a current flows into the second top region 104b. Thus, there is developed, in the CMOS of a relatively low withstand voltage, a tendency toward latchup.

In the structure of FIG. 10, however, the recombination layer 136 formed in the n⁻ intermediate layer 103 promotes the recombination of the holes 133 injected from the p+ bottom layer 101 into the n⁻ intermediate layer 103. Therefore, in the parasitic pnp transistor 134, the recombination layer 136 decreases the fraction of the minority carriers transported across the base to such a low value that the turn-on of the parasitic transistor 134 is prevented. In this way, the structure of FIG. 10 can prevent latch-up of the CMOS due to turn-on of the parasitic transistors 134 and 135.

The structure of FIG. 10 can prevent latch-up of the conductivity modulated MOSFET 110 as follows:

The conductivity modulated MOSFET 110 includes the p+ layer 101, the n⁻ layer 102, the p channel region 108, and the n+ source region 109. Therefore, parasitic pnp and npn transistors are formed in the conductivity modulated MOSFET 110, too. Both parasitic transistors of the MOSFET 110 are combined to form a pnpn thyristor structure. Therefore, the conductivity modulated MOSFET 110 tends to be latched by the holes 133 injected from the p+ layer 101 into the n⁻ intermediate layer 103.

However, the recombination layer 136 of the present invention promotes recombination of the holes 133 injected into the n⁻ intermediate layer 103, and decreases the number of the minority carriers which can traverse the base of the parasitic pnp transistor. Therefore, the recombination layer 136 prevents turn-on of the parasitic pnp transistor, and accordingly prevents latchup of the conductivity modulated MOSFET 110 due to turn-on of the parasitic pnp and npn transistors.

In the fourth and fifth embodiments, it is possible to form, in the n⁻ second top region 104b, a bipolar transistor instead of the nMOS 120 and pMOS 130.

What is claimed is:

1. A semiconductor device comprising:
an underlying layer formed in a semiconductor substrate body, said underlying layer including a first layer of a first conductivity type;
an overlying layer of said first conductivity type located over said underlying layer in said substrate body;
an isolation layer of a second conductivity type located between said overlying layer and said first layer;
an isolation region of said second conductivity type extending into said overlying layer from an upper surface of said overlying layer and contacting said isolation layer, said isolation region separating first and second portions of said overlying layer from each other, said second portion being separated from said underlying layer by said isolation layer;
a channel region of said second conductivity type located in said first portion of said overlying layer to form a vertical MOSFET;
an auxiliary region formed in said second portion of said overlying layer to form an auxiliary integrated circuit component;
a recombination layer capable of promoting recombination of carriers, said recombination layer being located under said second portion of said overlying layer and;
a highly doped buried layer of said first conductivity type located between said first portion of said overlying layer and said underlying layer;
wherein said recombination layer extends between said second portion of said overlying layer and said isolation layer, and further extends into said buried layer.

2. A semiconductor device comprising:
an underlying layer formed in a semiconductor substrate body, said underlying layer including a first layer of a first conductivity type;
an overlying layer of said first conductivity type located over said underlying layer in said substrate body;
an isolation layer of a second conductivity type located between said overlying layer and said first layer;
an isolation region of said second conductivity type extending into said overlying layer from an upper surface of said overlying layer and contacting said isolation layer, said isolation region separating first and second portions of said overlying layer from each other, said second portion being separated from said underlying layer by said isolation layer;
a channel region of said second conductivity type located in said first portion of said overlying layer to form a vertical MOSFET;
an auxiliary region formed in said second portion of said overlying layer to form an auxiliary integrated circuit component;
a recombination layer capable of promoting recombination of carriers, said recombination layer being located under said second portion of said overlying layer and;
a highly doped buried layer of said first conductivity type located between said first portion of said overlying layer and said underlying layer;
wherein said recombination layer extends between said second portion of said overlying layer and said isolation layer, and terminates without contacting said buried layer.

3. A semiconductor device comprising:
an underlying layer formed in a semiconductor substrate body, said underlying layer including a first layer of a first conductivity type;
an overlying layer of said first conductivity type located over said underlying layer in said substrate body;
an isolation layer of a second conductivity type located between said overlying layer and said first layer;
an isolation region of said second conductivity type extending into said overlying layer from an upper surface of said overlying layer and contacting said isolation layer, said isolation region separating first and second portions of said overlying layer from each other, said second portion being separated from said underlying layer by said isolation layer;
a channel region of said second conductivity type located in said first portion of said overlying layer to form a vertical MOSFET;
an auxiliary region formed in said second portion of said overlying layer to form an auxiliary integrated circuit component;
a recombination layer capable of promoting recombination of carriers, said recombination layer being located under said second portion of said overlying layer and;

a highly doped buried layer of said first conductivity type located between said first portion of said overlying layer and said underlying layer;
wherein said recombination layer is buried in said isolation layer.

4. A semiconductor device comprising:
an underlying layer formed in a semiconductor substrate body, said underlying layer including a first layer of a first conductivity type;
an overlying layer of said first conductivity type located over said underlying layer in said substrate body;
an isolation layer of a second conductivity type located between said overlying layer and said first layer;
an isolation region of said second conductivity type extending into said overlying layer from an upper surface of said overlying layer and contacting said isolation layer, said isolation region separating first and second portions of said overlying layer from each other, said second portion being separated from said underlying layer by said isolation layer;
a channel region of said second conductivity type located in said first portion of said overlying layer to form a vertical MOSFET;
an auxiliary region formed in said second portion of said overlying layer to form an auxiliary integrated circuit component;
a recombination layer capable of promoting recombination of carriers, said recombination layer being located under said second portion of said overlying layer and;
a highly doped buried layer of said first conductivity type located between said first portion of said overlying layer and said underlying layer;
wherein said underlying layer further comprises a highly doped second layer of said second conductivity type located under said first layer, and wherein said recombination layer being buried in said first layer of said underlying layer at a shallow position near an upper surface of said first layer.

5. A semiconductor device comprising:
an underlying layer formed in a semiconductor substrate body, said underlying layer including a first layer of a first conductivity type;
an overlying layer of said first conductivity type located over said underlying layer in said substrate body;
an isolation layer of a second conductivity type located between said overlying layer and said first layer;
an isolation region of said second conductivity type extending into said overlying layer from an upper surface of said overlying layer and contacting said isolation layer, said isolation region separating first and second portions of said overlying layer from each other, said second portion being separated from said underlying layer by said isolation layer;
a channel region of said second conductivity type located in said first portion of said overlying layer to form a vertical MOSFET;
an auxiliary region formed in said second portion of said overlying layer to form an auxiliary integrated circuit component;
a recombination layer capable of promoting recombination of carriers, said recombination layer being located under said second portion of said overlying layer and;
a highly doped buried layer of said first conductivity type located between said first portion of said overlying layer and said underlying layer;
wherein said underlying layer further comprises a highly doped second layer of said second conductivity type located under said first layer, and wherein said first portion of said overlying layer is located directly on said first layer of said underlying layer.

6. A semiconductor device according to claim 5 wherein said substrate body has an interface in which a first semiconductor substrate, including said first and second layers of said underlying layer, and a second semiconductor substrate, including said overlying layer and said isolation layer, are bonded together.

7. A semiconductor device comprising:
an underlying layer located in a semiconductor substrate body, said underlying layer including a first layer of a first conductivity type;
an overlying layer of said first conductivity type located over said underlying layer in said substrate body;
an isolating intermediate layer located between said underlying and overlying layers, said intermediate layer including an isolation layer of a second conductivity type;
an isolation region of said second conductivity type extending into said overlying layer from an upper surface of said overlying layer and contacting said intermediate layer, said isolation region separating first and second portions of said overlying layer from each other, said second portion being separated from said underlying layer by said isolation layer;
a channel region of said second conductivity type located in said first portion of said overlying layer to form a vertical MOSFET; and
an auxiliary region formed in said second portion of said overlying layer to form an auxiliary integrated circuit component;
wherein said substrate body comprises an upper part comprising a single crystal in which said overlying layer is located, a lower part comprising another single crystal in which said underlying layer is located, and an interface between said upper and lower parts, said interface being located in said intermediate layer.

8. A semiconductor device according to claim 7 wherein said intermediate layer further comprises a recombination layer capable of promoting recombination of carriers, said recombination layer being contiguous to said interface.

9. A semiconductor device according to claim 8 wherein said recombination layer is located on said isolation layer so as to separate said isolation layer from said overlying layer and from said isolation region, and wherein said isolation region contacts said recombination layer.

10. A semiconductor device according to claim 8 wherein said intermediate layer further comprises a layer of said first conductivity type located between said isolation layer and said recombination layer so that said recombination layer is separated from said isolation layer, and wherein said isolation region contacts said isolation layer.

11. A semiconductor device according to claim 7 wherein said intermediate layer consists only of said isolation layer, and wherein said underlying layer further comprises a highly doped second layer of said second conductivity type located under said first layer.

12. A semiconductor device according to claim 8 wherein said recombination layer is buried in said isolation layer so that said recombination layer is separated from said overlying layer and from said isolation region, and wherein said isolation layer is contiguous to said overlying layer and said isolation region.

13. A semiconductor device comprising:
an underlying layer located in a semiconductor substrate body, said underlying layer including a first layer of a first conductivity type;
an overlying layer of said first conductivity type located over said underlying layer in said substrate body, and bordered by an upper surface of said substrate body;
an isolating intermediate layer located between said underlying and overlying layers, said intermediate layer including an isolation layer of a second conductivity type and a recombination layer capable of promoting recombination of carriers;
an isolation region of said second conductivity type extending into said overlying layer from said upper surface of said substrate body and contacting said intermediate layer, said isolation region separating first and second portions of said overlying layer from each other, said second portion being separated from said underlying layer by said isolation layer;
a channel region of said second conductivity type located in said first portion of said overlying layer to form a vertical MOSFET; and
an auxiliary region located in said second portion of said overlying layer to form a CMOS, said auxiliary region including a first pair of source and drain regions of said second conductivity type which both extend from said upper surface of said substrate body into said overlying layer, and a second pair of source and drain regions of said first conductivity type which both extend from said upper surface of said substrate body into a well region of said second conductivity type, said well region extending from said upper surface of said substrate body into said overlying layer;
wherein said recombination layer is further from said upper surface of said substrate body than said well region.

14. A semiconductor device according to claim 13 wherein said recombination layer is made of polycrystalline silicon.

15. A semiconductor device according to claim 13 further comprising a highly doped buried layer of said first conductivity type, located between said first portion of said overlying layer and said underlying layer.

16. A semiconductor device according to claim 13 wherein said recombination layer is located further from said upper surface of said substrate body than said channel region so that said recombination layer is separate from said channel region.

17. A semiconductor device according to claim 13 wherein said substrate body comprises an upper part comprising a single crystal in which said overlying layer is located, a lower part comprising another single crystal in which said underlying layer is located, and an interface between said upper and lower parts, said interface being contiguous to said recombination layer.

* * * * *